(12) United States Patent
Ohkawa et al.

(10) Patent No.: US 10,209,317 B2
(45) Date of Patent: Feb. 19, 2019

(54) BATTERY CONTROL DEVICE FOR CALCULATING BATTERY DETERIORATION BASED ON INTERNAL RESISTANCE INCREASE RATE

(71) Applicant: Hitachi Automotive Systems, Ltd., Hitachinaka-shi, Ibaraki (JP)

(72) Inventors: Keiichiro Ohkawa, Hitachinaka (JP); Naoyuki Igarashi, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 173 days.

(21) Appl. No.: 14/892,508

(22) PCT Filed: May 23, 2013

(86) PCT No.: PCT/JP2013/064371
§ 371 (c)(1),
(2) Date: Nov. 19, 2015

(87) PCT Pub. No.: WO2014/188562
PCT Pub. Date: Nov. 27, 2014

(65) Prior Publication Data
US 2016/0097819 A1   Apr. 7, 2016

(51) Int. Cl.
  *G01N 27/416* (2006.01)
  *G01R 31/36* (2006.01)
(52) U.S. Cl.
  CPC ..... *G01R 31/3662* (2013.01); *G01R 31/3624* (2013.01); *G01R 31/3679* (2013.01); *G01R 31/3651* (2013.01)
(58) Field of Classification Search
  CPC ............ G01R 31/3662; G01R 31/3624; G01R 31/3679; G01R 31/3651; G01R 31/3648; Y02E 60/12; H01M 10/48
  (Continued)

(56) References Cited

U.S. PATENT DOCUMENTS 9,529,056 B2 * 12/2016 Kanada ............... G01R 31/3679
2004/0012373 A1 * 1/2004 Sakakibara ........ G01R 31/3662
  320/132

(Continued)

FOREIGN PATENT DOCUMENTS

EP    2 424 070 A2   2/2012
JP    2000-215923 A   8/2000

(Continued)

OTHER PUBLICATIONS

Extended European Search Report issued in counterpart European Application No. 13885168.8 dated Dec. 16, 2016 (nine (9) pages).

(Continued)

*Primary Examiner* — Yalkew Fantu
*Assistant Examiner* — Mohammed J Sharief
(74) *Attorney, Agent, or Firm* — Crowell & Moring LLP

(57) ABSTRACT

A battery monitoring device includes: a current detection unit that detects an electric current flowing through a battery; a voltage detection unit that detects a voltage between both ends of the battery; a temperature detection unit that detects the temperature of the battery; an internal resistance increase rate calculation unit that calculates the internal resistance increase rate of the battery based on the detected electric current, voltage between the both ends, and temperature; and a calculation invalid time setting unit that sets a predetermined calculation invalid time according to the characteristics of the internal resistance increase rate. The calculation results of the internal resistance increase rate is invalidated for an invalid period from the start of charging or discharging of the battery to the lapse of the calculation invalid time.

12 Claims, 21 Drawing Sheets

(58) Field of Classification Search
USPC .......................................................... 324/430
See application file for complete search history.

(56) References Cited

U.S. PATENT DOCUMENTS

| | | |
|---|---|---|
| 2006/0113959 A1 | 6/2006 | Honma |
| 2007/0001679 A1* | 1/2007 | Cho ................... G01R 31/3662 324/426 |
| 2007/0200567 A1 | 8/2007 | Mizuno et al. |
| 2009/0099802 A1 | 4/2009 | Barsoukov et al. |
| 2010/0001693 A1* | 1/2010 | Iida .................... G01R 31/3679 320/134 |
| 2010/0244886 A1 | 9/2010 | Kawahara et al. |
| 2011/0187329 A1 | 8/2011 | Majima et al. |
| 2012/0004875 A1* | 1/2012 | Maeda ................. H01M 10/48 702/63 |
| 2013/0110431 A1* | 5/2013 | Takada ................. H01M 10/44 702/63 |
| 2014/0095092 A1* | 4/2014 | Ikeda ................. G01R 31/3606 702/63 |

FOREIGN PATENT DOCUMENTS

| | | |
|---|---|---|
| JP | 2009-95211 A | 4/2009 |
| JP | 2010-256323 A | 11/2010 |

OTHER PUBLICATIONS

International Search Report (PCT/ISA/210) issued in PCT Application No. PCT/JP2013/064371 dated Jul. 23, 2013 with English translation (Two (2) pages).

International Preliminary Report on Patentability (PCT/IPEA/410) issued in PCT Application No. PCT/JP2013/064371 dated Jan. 9, 2015 (Four (4) pages).

* cited by examiner

FIG. 13

| CURRENT (ABSOLUTE VALUE) AXIS (UNIT: A) | ... | 10 | 30 | 80 | ... |
|---|---|---|---|---|---|
| CALCULATION INVALID TIME MAP (UNIT: SECOND) | ... | 0.5 | 0.6 | 0.7 | ... |

FIG. 16

| TEMPERATURE AXIS (UNIT: °C) | ... | 10 | 35 | 50 | ... |
|---|---|---|---|---|---|
| CALCULATION INVALID TIME MAP (UNIT: SECOND) | ... | 0.5 | 0.6 | 0.7 | ... |

FIG. 19

| SOC AXIS (UNIT: %) | ... | 30 | 50 | 70 | ... |
|---|---|---|---|---|---|
| CALCULATION INVALID TIME MAP (UNIT: SECOND) | ... | 0.5 | 0.6 | 0.7 | ... |

BATTERY CONTROL DEVICE FOR CALCULATING BATTERY DETERIORATION BASED ON INTERNAL RESISTANCE INCREASE RATE

TECHNICAL FIELD

The present invention relates to a battery control device.

BACKGROUND ART

Electric-powered vehicles are equipped with storage batteries such as zinc batteries, nickel hydride batteries, or lithium ion batteries. These storage batteries supply electric power required for running hybrid automobiles and electric cars.

PTL 1 shown below describes a technique for determining whether an electric storage unit is at the end of life by calculating the rate of increase in internal resistance value based on an internal resistance value determined by correction and an initial internal resistance value.

CITATION LIST

Patent Literature

PTL 1: JP 2010-256323 A

SUMMARY OF INVENTION

Technical Problem

According to the technique described in the PTL 1, it is determined whether the electric storage unit is at the end of life according to the rate of increase in calculated internal resistance value. This is an effective method in the case where the battery has a characteristic that the rate of increase in internal resistance value is uniform. However, some kind of battery has a characteristic that the rate of increase in internal resistance value is not uniform until after lapse of a certain time since the battery starts to be charged or discharged. In the case of such a battery, the correct rate of increase in internal resistance value cannot be obtained depending on energization time. This may undesirably result in occurrence of errors in increase rate or mistakes in determining the end of life.

The present invention is devised to solve the foregoing problem. An object of the present invention is to provide a battery control device that makes it possible to obtain the stable rate of increase in internal resistance value regardless of energization time, taking into account the characteristics of the rate of increase in internal resistance value.

Solution to Problem

A battery control device according to the present invention includes: a current detection unit that detects an electric current flowing through a battery; a voltage detection unit that detects a voltage between both ends of the battery; a temperature detection unit that detects the temperature of the battery; an internal resistance increase rate calculation unit that calculates the internal resistance increase rate of the battery based on the electric current detected by the current detection, unit, the voltage between the both ends detected by the voltage detection unit, and the temperature detected by the temperature detection unit; and a calculation invalid time setting unit that sets a predetermined calculation invalid time according to the characteristics of the internal resistance increase rate, wherein the calculation results of the internal resistance increase rate is invalidated for an invalid period from the start of charging or discharging of the battery to the lapse of the calculation invalid time.

Advantageous Effects of Invention

According to the battery control device in the present invention, it is possible to obtain the stable rate of increase in internal resistance value regardless of energization time taking into account the characteristics of the rate of increase in internal resistance value of the currently used battery.

BRIEF DESCRIPTION OF DRAWINGS

FIG. 2 is a diagram illustrating a circuit configuration of an electric cell control unit 121a.

FIG. 13 is a diagram illustrating an example of a calculation invalid time map for use in setting a calculation invalid time by a calculation invalid time setting unit 151.

FIG. 16 is a diagram illustrating an example of a calculation invalid time map for use in setting a calculation invalid time by the calculation invalid time setting unit 151.

FIG. 19 is a diagram illustrating an example of a calculation invalid time map for use in setting a calculation invalid time by the calculation invalid time setting unit 151.

DESCRIPTION OF EMBODIMENTS

Embodiments of the present invention will be described below with reference to the accompanying drawings. In the following descriptions of the embodiments, the present invention is applied to a battery control device tat controls a battery system constituting a power source for a plug-in hybrid electric vehicle (PHEV) as an example.

In addition, in the following description of the embodiments, lithium ion batteries are employed as an example. However, the present invention is also applicable to nickel hydride batteries, zinc batteries, electric double layer capacitors, hybrid capacitors, and other. In the following embodiments, electric cells are connected in series to form an assembled battery. Alternatively, electric cells connected in parallel may be connected in series to form an assembled battery, or electric cells connected in series may be connected in parallel to form an assembled battery.

<System Configuration>

Figure 1:
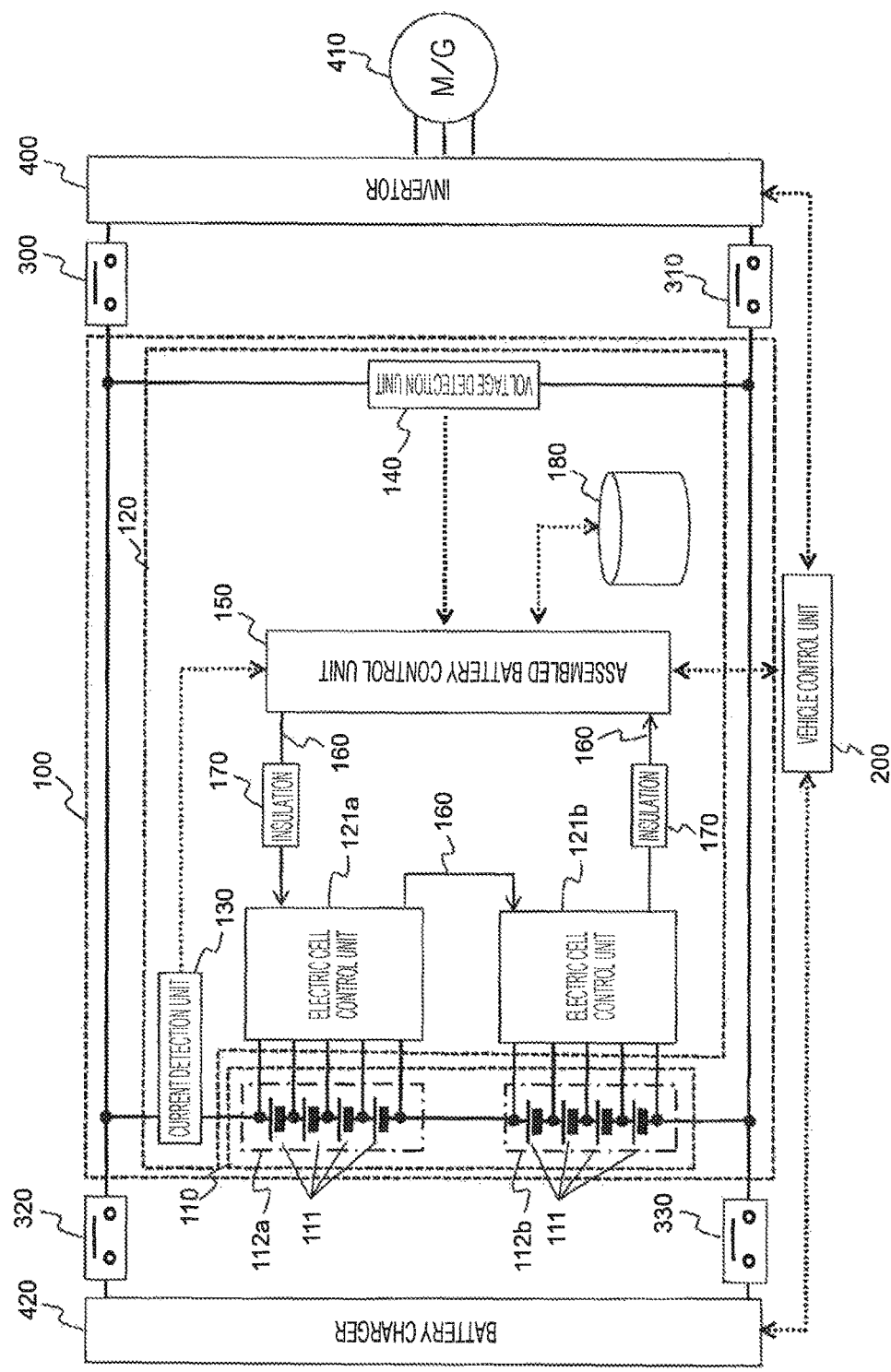
FIG. 1 is a diagram illustrating a configuration of a battery system 100 and its peripherals.

FIG. 1 is a diagram illustrating a configuration of a battery system 100 including a battery control device 120 and its peripherals. The battery system 100 is connected to an inverter 400 via relays 300 and 310. The battery system 100 includes an assembled battery 110 and the battery control device 120. The battery control device 120 includes electric cell control units 121a and 121b, a current detection unit 130, a voltage detection unit 140, an assembled battery control unit 150, and a storage unit 180.

The assembled battery 110 is formed by connecting in series electric cell groups 112a and 112b each composed of a plurality of electric cells 111. The electric cell control units 121a and 121b are connected to the electric cell groups 112a and 112b, respectively, to detect the voltages (voltages between both ends) and temperatures of the electric cells 111 constituting the electric cell groups and transmit signals indicative of detection results to the assembled battery control unit 150 via a signal communication path 160 and an insulation 170. The insulation 170 may be a photo coupler, for example.

The current detection unit 130 detects an electric current flowing through the assembled battery 110. The voltage detection unit 140 detects a voltage between both ends of the assembled battery 110, that is, a total voltage of the electric cells 111 connected in series in the assembled battery 110.

The assembled battery control unit 150 acquires the battery voltages and temperatures of the electric cells 111 according to the signals from the electric cell control units 121a and 121b. The assembled battery control unit 150 also receives the value of electric current flowing through the assembled battery 110 from the current detection unit 130, and receives the total voltage value of the assembled battery 110 from the voltage detection unit 140. The assembled battery control unit 150 detects the state of the assembled battery 110 and controls the assembled battery 110 based on the acquired information. The assembled battery control unit 150 transmits the detection results of the state of the assembled battery 110 to the electric cell control units 121a, 121b and a vehicle control unit 200.

The assembled battery 110 is formed by connecting electrically in series the plurality of electric cells 111 capable of accumulating and discharging electric energy (charging and discharging of DC power). The electric cells 111 constituting the assembled battery 110 are grouped by predetermined unit for execution of state management and control. The grouped electric cells 111 are electrically connected in series to form the electric cell groups 112a and 112b. The number of the electric cells 111 constituting the electric cell group 112 may be the same or different between the electric cell groups 112. In this embodiment, for the sake of simplified description, the four each electric cells 111 are electrically connected in series to form the electric cell groups 112a and 112b, and the electric cell groups 112a and 112b are further electrically connected in series so that the assembled battery 110 includes the total eight electric cells 111 as illustrated in FIG. 1.

The method for communications between the assembled battery control unit 150 and the electric cell control units 121a and 121b will be described. The electric cell control units 121a and 121b are connected in, series in decreasing order of potential in the electric cell groups 112a and 112b monitored by the electric cell control units 121a and 121b, respectively. Signals transmitted from the assembled battery control unit 150 are input into the electric cell control unit 121a via the insulation 170 and the signal communication path 160. Outputs from the electric cell control unit 121a are input into the electric cell control unit 121b via the signal communication path 160. Outputs from the electric cell control unit 121b in the lowest order are transmitted to the assembled battery control unit 150 via the insulation 170 and the signal communication path 160. In this embodiment, no insulation is provided between the electric cell control unit 121a and the electric cell control unit 121b. However, the electric cell control unit 121a and the electric cell control unit 121b may exchange signals via an insulation.

The storage unit 180 stores various kinds of information, necessary for the assembled battery control unit 150 to control the assembled battery 110. For example, the storage unit 180 stores the information on the charging states (SOC: state of charge) of the electric cells 111, the information on internal resistances of the electric cells 111, and the like. The details of the information will be described late.

The assembled battery control unit 150 performs various processes and calculations for control of the assembled battery 110 using the information received from the electric cell control units 121a and 121b, the current detection unit 130, the voltage detection unit 140, and the vehicle control unit 200, the information stored in the storage unit 180, and the like. For example, the assembled battery control unit 150 performs calculations of SOC and health states (SOH: state of health) of the electric cells 111, calculation of allowable power chargeable and dischargeable by the assembled battery 110, determination on the abnormal state of the assembled battery 110, calculation for control of charging and discharging amounts of the assembled battery 110, and the like. Then, the assembled battery control unit 150 outputs the information necessary for control of the assembled battery 110 to the electric cell control units 121a, 121b and the vehicle control unit 200, based on the results of the calculations.

The vehicle control unit 200 controls the inverter 400 connected to the battery system 100 via the relays 300 and 310 using the information from the assembled battery control unit 150. During running of the vehicle, the battery system 100 is connected to the inverter 400. The inverter 400 dives a motor generator 410 using the energy stored in the assembled battery 110 of the battery system 100.

When a vehicle system equipped with the battery system 100 is started to run the vehicle, the battery system 100 is connected to the inverter 400 under the management of the vehicle control unit 200. Then, the inverter 400 drives the motor generator 410 using the energy stored in the assembled battery 110. Meanwhile, at the time of power regeneration, the assembled battery 110 is charged with power generated by the motor generator 410.

When the battery system 100 is connected to a battery charger 420 via the relays 320 and 330, the assembled battery 110 is charged with a charging current supplied from the battery charger 420 until the assembled battery 110 satisfies a predetermined condition. The energy stored in the assembled battery 110 by charging is used for the next running of the vehicle and also for operation of electric components inside and outside the vehicle. In addition, as necessary, the energy may be released to an external power source typified by a household power source. The battery charger 420 is included in a household power source or an external power source typified by an electric stand. When the vehicle equipped with the battery system 100 is connected to any of these power sources, the battery system 100 and the battery charger 420 are connected based on the information transmitted from the vehicle control unit 200.

Figure 2:
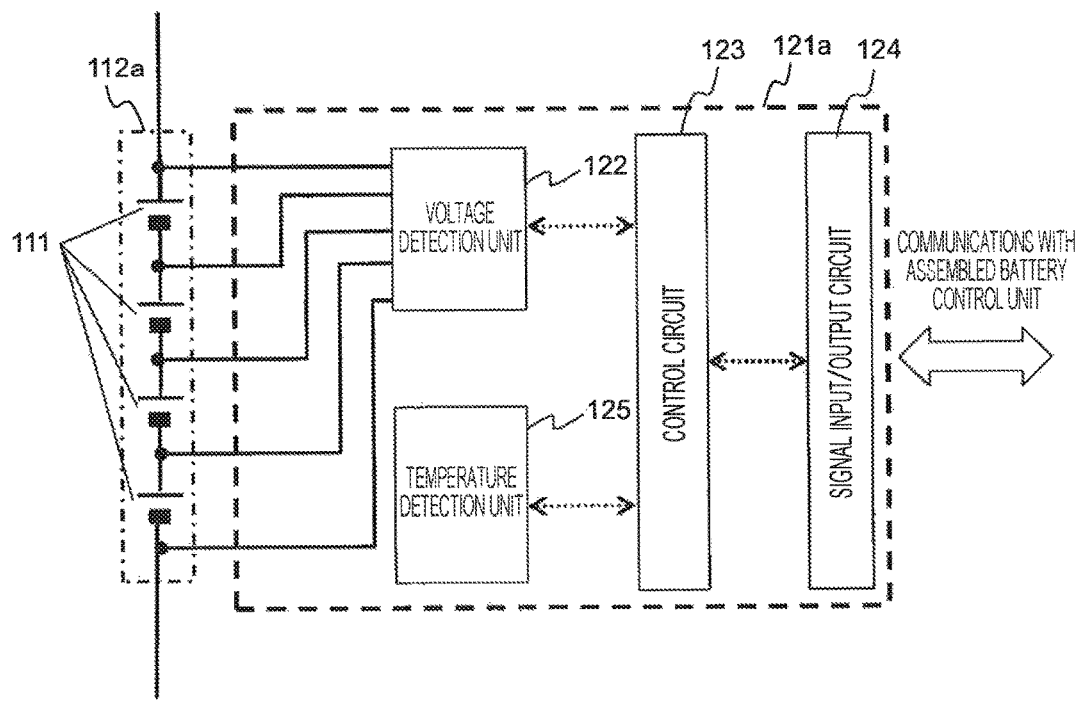

FIG. 2 is a diagram illustrating a circuit configuration, of the electric cell control unit 121a. As illustrated in FIG. 2, the electric cell control unit 121a includes a voltage detection unit 122, a control circuit 123, a signal input/output circuit 124, and a temperature detection unit 125. The electric cell control unit 121a and the electric cell control unit 121b illustrated in FIG. 1 are the same in circuit configuration. Accordingly, FIG. 2 illustrates the circuit configuration of the electric cell control unit 121a as a representative.

The voltage detection unit 122 measures voltages between terminals (voltages between both ends) of the electric cells 111. The control circuit 123 receives the measurements results from the voltage detection unit 122 and the temperature detection unit 125, and transmits the same to the assembled battery control unit 150 via the signal input/output circuit 124. Although not illustrated in FIG. 2, the electric cell control unit 121a is provided with a known circuit configuration to smooth out variations in voltage and SOC among the electric cells 111 resulting from self-discharge, differences in consumption current, and the like. The operations of the circuit are controlled by the control circuit 123.

Referring to FIG. 2, the temperature detection unit 125 has the function to measure the temperature of the electric cell group 112a. The temperature detection unit 125 measures the temperature of the entire electric cell group 112a, and handles the temperature as a representative value of temperatures of the electric cells 111 constituting the electric cell group 112a. The result of temperature measurement by the temperature detection unit 125 is used at the assembled battery control unit 150 in various calculations for detecting the states of the electric cells 111, the electric cell group 112a, and the assembled battery 110. The temperature measured by the temperature detection unit 125 is handled not only as the temperature of the electric cell group 112a but also as the temperature of the electric cells 111 of the electric cell group 112a. Further, the assembled battery control unit 150 may determine the temperature of the assembled battery 110 by averaging the temperature of the electric cell group 112a measured by the temperature detection unit 125 of the electric cell control unit 121a and the temperature of the electric cell group 112b measured by the temperature detection unit 125 of the electric cell control unit 121b, for example.

In the example of FIG. 2, the electric cell control unit 121a has one temperature detection unit 125. Alternatively, the electric cells 111 may each have the temperature detection unit 125 to measure the temperatures of the individual electric cells 111 such that the assembled battery control unit 150 performs various calculations based on the measurement results. In this case, however, the configuration of the electric cell control unit 121a becomes complicated by the increased number of the temperature detection units 125. Alternatively, the entire assembled battery 110 may have one temperature detection unit 125.

FIG. 2 illustrates the temperature detection unit 125 simply in one block. However, a temperature sensor is actually provided for the electric cell group 112a as a temperature measurement target. The temperature sensor outputs temperature information as a voltage signal. Based on the voltage signal, the control circuit 123 calculates the temperature of the electric cell group 112a to obtain the temperature measurement result of the electric cell group 112a. The control circuit 123 transmits the calculated temperature measurement result to the signal input/output circuit 124, and the signal input/output circuit 124 outputs the temperature measurement result to the outside of the electric cell control unit 121a. The function for executing this series of operations is implemented by the temperature detection unit 125 in the electric cell control unit 121a. Alternatively, the voltage detection, unit 122 may measure the voltage signal output from the temperature sensor.

Various embodiments for the assembled battery control unit 150 to calculate the SOH and allowable power of the assembled battery 110 will be described below.

First Embodiment

Figure 3:
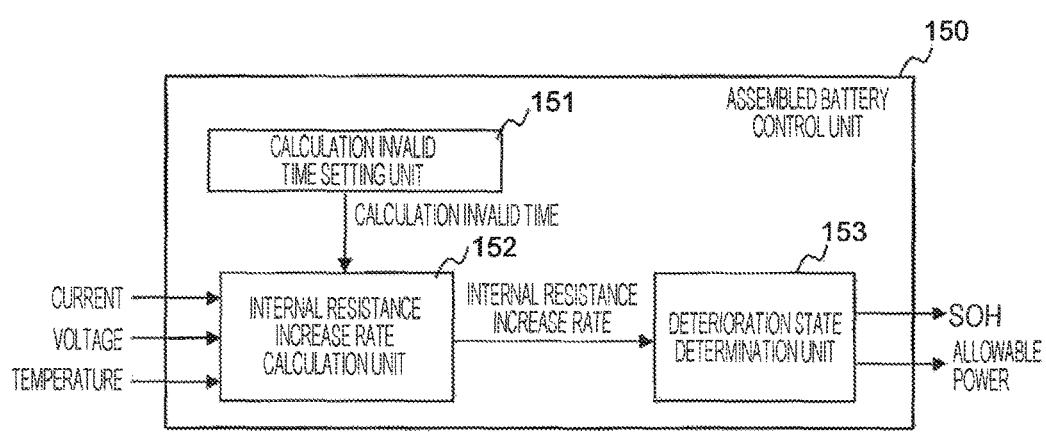
FIG. 3 is a diagram illustrating control blocks of an assembled battery control unit 150 according to a first embodiment.

FIG. 3 is a diagram illustrating control blocks of the assembled battery control unit 150 accord ing to a first embodiment. The assembled battery control unit 150 has functionally the control blocks of a calculation invalid time setting unit 151, an internal resistance increase rate calculation unit 152, and a deterioration state determination unit 153 as a configuration for calculating the SOH and allowable power of the assembled battery 110.

The calculation invalid time setting unit 151 sets a predetermined calculation invalid time for the calculation of internal resistance increase rate by the internal resistance increase rate calculation unit 152. The calculation invalid time is set according to the characteristics of the internal resistance increase rate of the assembled battery 110. The details thereof will be described later.

The electric current detected by the current detection unit 130, the voltage between both ends of the assembled battery 110 detected by the voltage detection unit 140, and the temperature detected by the temperature detection unit 125 are input into the internal resistance increase rate calculation unit 152. The internal resistance increase rate calculation unit 152 calculates the internal resistance increase rate of the assembled battery 110 based on the input information, and outputs the calculated result to the deterioration state determination unit 153.

To calculate the internal resistance increase rate, the internal resistance increase rate calculation unit 152 first determines the timing at which the assembled battery 110 started to be charged or discharged according to the polarity of the current detected by the current detection unit 130, and calculates the energization time from the timing. Then, the internal resistance increase rate calculation unit 152 compares the calculated energization time to the calculation invalid time set by the calculation invalid time setting unit 151. As a result, when the energization time is equal to or longer than the calculation invalid time, the internal resistance increase rate calculation unit 152 determines the calculation result of the internal resistance increase rate as valid. In this case, the internal resistance increase rate calculation unit 152 determines the internal resistance increase rate of the assembled battery 110 by performing a calculation as described later with the use of the input detection results of current, voltage, and temperature, and then outputs the calculation result to the deterioration state determination unit 153 and holds the same therein at the same time. Meanwhile, when the energization time is shorter than the calculation invalid time, the internal resistance increase rate calculation unit 152 determines the calculation result of the internal resistance increase rate as invalid. In this case, the internal resistance increase rate calculation unit 152 stops the calculation of the internal resistance increase rate of the assembled battery 110, and outputs to the deterioration state determination unit 153 the internal resistance increase rate held therein when having previously determined the calculation result of the internal resistance increase rate as valid.

The deterioration state determination unit 153 determines the degree of deterioration of the assembled battery 110 based on the calculation result of the internal resistance increase rate output from the internal resistance increase rate calculation unit 152. Then, the deterioration state determination unit 153 outputs the SOH according to the determined degree of health and the value of allowable power chargeable and dischargeable by the assembled battery 110 to the electric cell control units 121a, 121b and the vehicle control unit 200.

In the foregoing example, when having determined the calculation result of the internal resistance increase rate as invalid, the internal resistance increase rate calculation unit 152 outputs the internal resistance increase rate hold therein. Alternatively, the internal resistance increase rate calculation unit 152 may decide in advance a special value indicating that the calculation result is invalid, and output the same in place of the held internal resistance increase rate. Otherwise, the internal resistance increase rate calculation unit 152 may output a value indicating that the calculation result is valid or invalid together with the calculation result of the internal resistance increase rate.

In the foregoing example, the internal resistance increase rate calculation unit 152 calculates the internal resistance increase rate with the use of the detection results of current, voltage, and temperature. However, the detection result of temperature is not necessarily required. When fluctuation in the internal resistance increase rte of the assembled battery 110 is small with temperature changes, the detection result of temperature may not be used. In this case, the battery control device 120 may not be provided with the temperature detection unit 125. Further, information other than the detection results of current and voltage, for example, the SOC of the assembled battery 110 may be input so that the input value may be used for calculation of the internal resistance increase rate.

In the foregoing example, the voltage between the both ends of the assembled battery 110 detected by the voltage detection unit 140 is used to calculate the internal resistance increase rate. Alternatively, the voltage between the both ends of the assembled battery 110 may be acquired by another method. For example, the voltage between the both ends of the assembled battery 110 may be acquired according to the voltage between terminals of the electric cells 111 detected by the voltage detection units 122 provided in the electric cell control units 121a and 121b, and the acquired voltage may be used to calculate the internal resistance increase rate.

First Embodiment: Concept of System Operations

Figure 4:
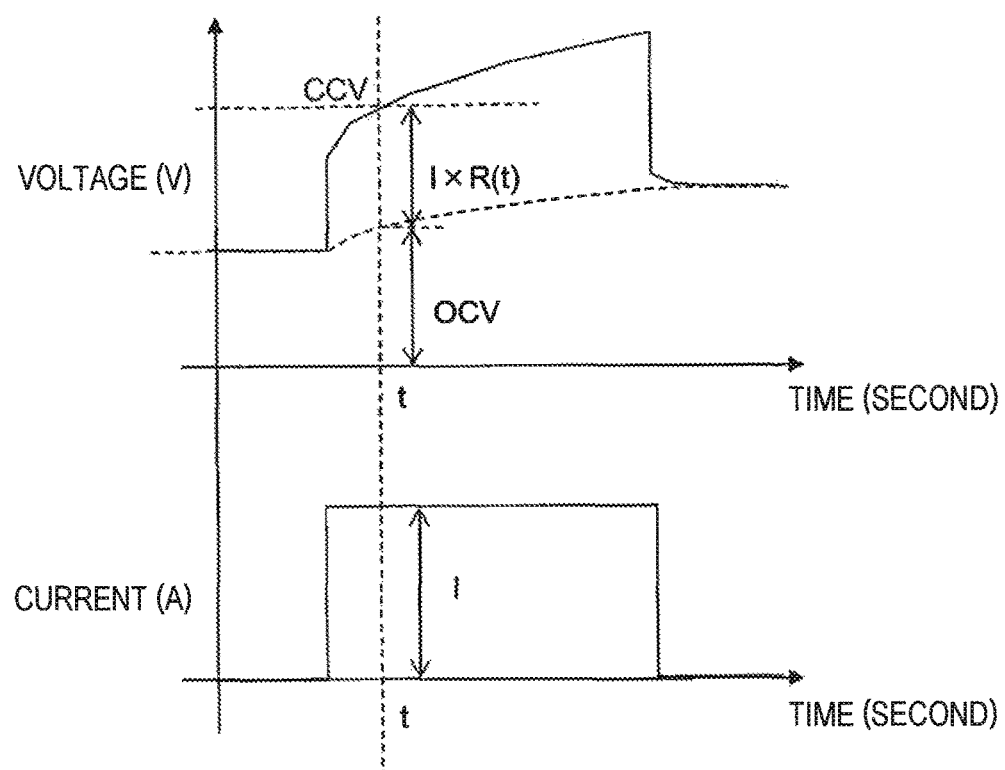
FIG. 4 is a graph illustrating an example of time changes in current and voltage when a charging current of a constant value flows through an assembled battery 110.

Next, the method for calculating the internal resistance increase rate of the assembled battery 110 by the internal resistance increase rate calculation unit 152 will be described. FIG. 4 is a graph illustrating an example of time changes in current and voltage when a charging current of a constant vale flows through the assembled battery 110. In the graph of FIG. 4, the lateral axis indicates time, and the vertical axis indicates the voltage between the both ends of the assembled battery 110 in the upper graph and indicates the electric current flowing through the assembled battery 110 in the lower graph.

Referring to FIG. 4, when the current in the assembled battery 110 at a time t during charging is designated as I and the voltage between the both ends as CCV, the relationship between I and CCV can be expressed by the following (equation 1) from a general battery equivalent circuit model:

$$CCV = OCV + I \times R \quad \text{(Equation 1)}$$

In the foregoing (equation 1), CCV is detected by the voltage detection unit 140, and I is detected by the current detection unit 130. In addition, OCV indicates the open-circuiit voltage in the assembled battery 110, and R indicates the internal resistance value of the assembled battery 11. By modifying the (equation 1), the following (equation 2) can be obtained:

$$R = (CCV - OCV) \div I \quad \text{(Equation 2)}$$

In the following (equation 2), CCV and I can be detected by the voltage detection unit 140 and the current detection unit 130, respectively. In addition, OCV cannot be directly detected but can be determined by any of known methods based on, the detection values of CCV and I. As known methods, for example, the values of OCV corresponding to the combinations of CCV and I may be stored in advance so that OCV is determined based on the information on the values, or the SOC of the battery may be determined and converted into OCV by the use of a characteristic map indicating the relationship between SOC and OCV stored in advance. The details of how to determine OCV will not descried herein. Therefore, an internal resistance value R of the assembled battery 110 as an unknown value can be determined by the foregoing (equation 2) using CCV, I, and OCV.

The internal resistance increase rate calculation unit 152 determines the internal resistance value R of the assembled battery 110 by the calculation method as descried above, and then calculates an internal resistance increase rate SOHR by the following (equation 3). In the equation 3, Rmap indicates the initial value of internal resistance of the assembled battery 110. The value of the initial internal resistance Rmap is stored in advance in the storage unit 180.

$$SOHR = R + Rmap \quad \text{(Equation 3)}$$

The thus determined internal resistance increase rate SOHR is almost 1 when the assembled battery 110 is new, and becomes larger than 1 as the internal resistance increases with the progression of deterioration of the assembled battery 110. Therefore, the degree of deterioration of the assembled battery 110 can be determined from the value of the internal resistance increase rate SOHR.

Figure 5:
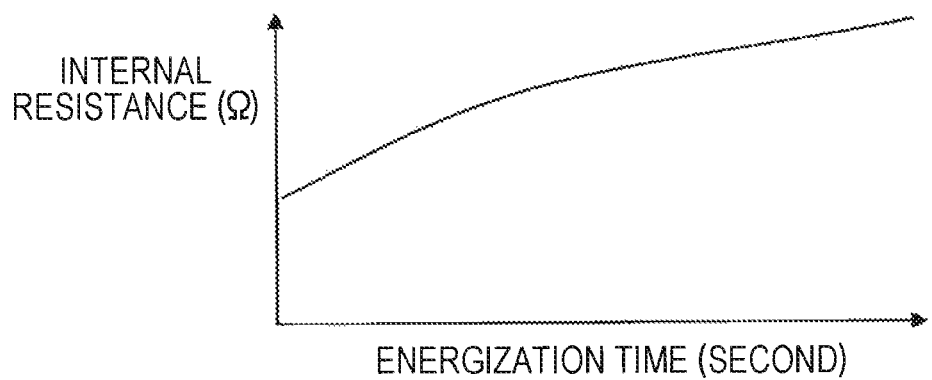
FIG. 5 illustrates an example of a graph indicating the relationship between the length of energization time and internal resistance.
Figure 6:
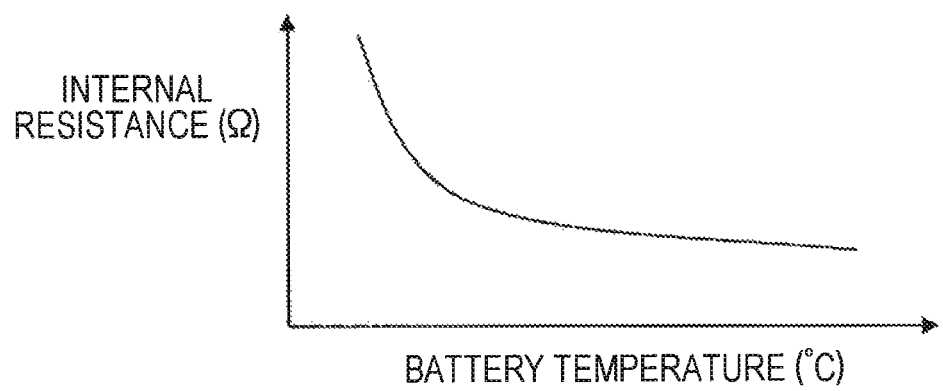
FIG. 6 illustrates an example of a graph indicating the relationship between the temperature and internal resistance of the battery.

The internal resistance increase rate SOHR is an index of the degree of deterioration of the assembled battery 110. Accordingly, the vale of the internal resistance increase rate SOHR is desirably the same at any time as far as the health state of the assembled battery 110 remains unchanged. However, it is generally known that the internal resistance of a battery varies depending on the length of energization time and the temperature of the battery as illustrated in FIGS. 5 and 6. FIG. 5 illustrates an example of a graph indicating the relationship between the length of energization time and internal resistance. FIG. 6 illustrates an example of a graph indicating the relationship between the temperature and internal resistance of the battery.

As described above, the internal resistance value R determined by the (equation 2) varies depending on the energization time and the temperature of the assembled battery 110. Accordingly, when the initial internal resistance Rmap is set as a constant value in the (equation 3), the internal resistance increase rate SOHR varies depending on the energization time and the temperature, and it is thus not possible to determine as appropriate the degree of deterioration of the assembled battery 110.

Figure 7:
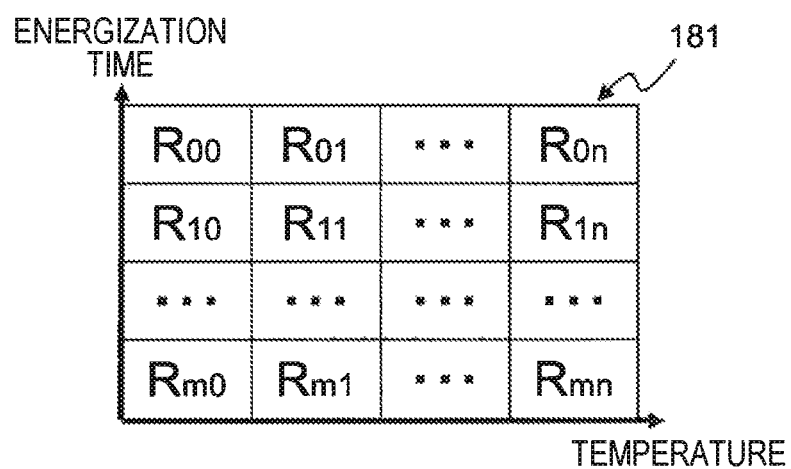
FIG. 7 illustrates an example of map values 181 of an initial internal resistance Rmap determined on axes of energization time and temperature.

Accordingly, the internal resistance increase rate calculation unit 152 desirably changes the initial internal resistance Rmap in the (equation 3) with the energization time and the temperature of the assembled battery 110 as parameters. For example, the internal resistance increase rate calculation unit 152 acquires in advance the values of initial internal resistance of the assembled battery 110 at respective energization times and temperatures, and stores the same as map values of the initial internal resistance Rmap in the storage unit 180. FIG. 7 illustrates an example of map values 181 of initial internal resistance Rmap determined on axes of energization time and temperature. By doing this, it is possible to select from among the map values 181 the value of the initial internal resistance Rmap satisfying the conditions of energization time and temperature on which the internal resistance value R was determined, and determine appropriately the internal resistance increase rate SOHR by the (equation 3) using the selected value.

However, depending on the kind of battery, even when the parameters of energization time and temperature have the same values as the stored ones, the internal resistance increase rate SOHR determined by the (equation 3) using the method as described above may not take on a constant value. This point will be described below.

Figure 8:
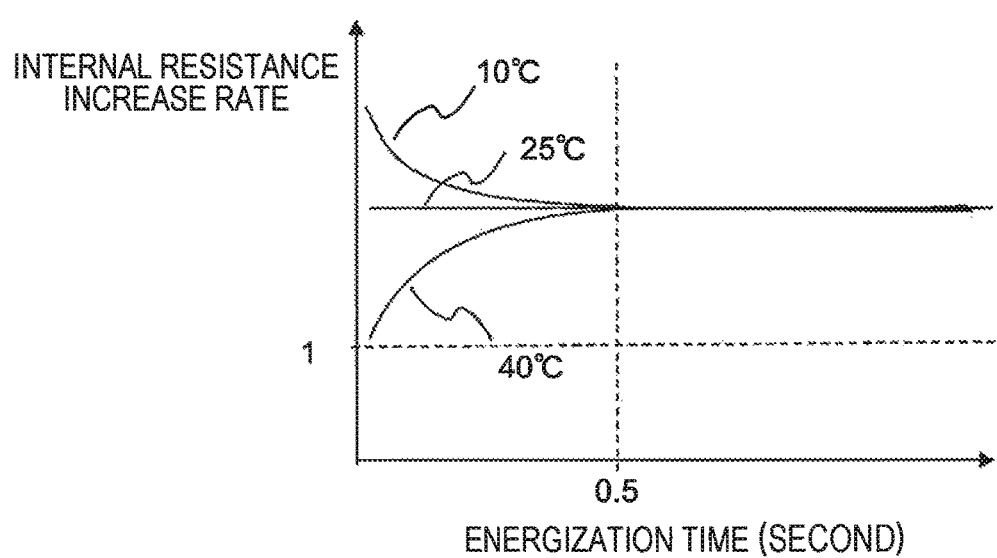
FIG. 8 is a graph illustrating an example of the relationship between internal resistance increase rate and energization time in the event of deterioration of the battery.

FIG. 8 is a graph indicating an example of the relationship between internal resistance increase rate and energization time when a certain kind of battery (for example, a kind of lithium ion battery) becomes deteriorated. This graph indicates the measurement results of internal resistance increase rate for different energization times at temperatures of the battery of 10° C., 25° C., and 40° C.

Referring to FIG. 8, the internal resistance increase rate acquired at 25° C. is almost constant even with changes in the energization time. In contrast, the internal resistance increase rate acquired at 10° C. takes on a higher value in the range of energization times of about 0.5 second or less than in the other range, which makes the battery appear more deteriorated. Meanwhile, the internal resistance increase rate acquired at 40° C. takes on a lower value in the range of energization times of about 0.5 second or less than in the other range, which makes the battery appear less deteriorated.

As described above, some kind of battery, when becoming deteriorated, may not have a constant value of internal resistance increase rte depending on the temperature and the energization time, and may exhibit different characteristics. In such a battery, the internal resistance increase rate SOHR does not take on a constant value according to the degree of deterioration even when the map value of the initial internal resistance Rmap set with the energization time and the temperature as parameters is used as described above. Accordingly, the degree of deterioration of the battery may not be correctly determined.

Accordingly, to determine correctly the degree of deterioration even in the case of the battery with the characteristics as illustrated in FIG. 8, the internal resistance increase rate calculation unit 152 determines whether the calculation is valid or invalid with the energization time as a parameter using the calculation invalid time set by the calculation invalid time setting unit 151. According to the example of FIG. 8, the internal resistance increase rate takes on an almost constant value at any of the temperatures in the range of energization times of about 0.5 second or more. Therefore, by determining the calculation of the internal resistance increase rate as valid in this range and determining the calculation of the internal resistance increase rate as invalid in the range of less than about 0.5 second, it is possible to obtain the stable internal resistance increase rate regardless of the temperature.

In the foregoing case, the calculation invalid time setting unit 151 sets about 0.5 second as the calculation invalid time for the internal resistance increase rate calculation unit 152. The internal resistance increase rate calculation unit 152 calculates the internal resistance increase rate SOHR after an invalid period from the start of charging or discharging of the assembled battery 110 to the lapse of the calculation invalid time.

As described above, the internal resistance increase rate calculation unit 152 determines the polarity of the current as an input value and measures the energization time from the start of charging or discharging. The internal resistance increase rate calculation unit 152 compares the energization, time to the calculation invalid time set by the calculation invalid time setting unit 151. When the energization time is equal to or longer than the calculation invalid time, the internal resistance increase rate calculation unit 152 determines the calculation as valid and outputs the internal resistance increase rate and holds the same therein at the same time. In contrast, when the energization time is shorter than the calculation invalid time, the internal resistance increase rate calculation unit 152 determines the calculation as invalid and outputs the internal resistance increase rate held therein when having previously determined the calculation as valid. By using the internal resistance increase rate, the deterioration state determination unit 153 can detect correctly the degree of deterioration of the assembled battery 110 even within the invalid period from the start of charging or discharging to the lapse of the calculation invalid time. At that time, the deterioration state determination unit 153 outputs certain SOH as health state of the assembled battery 110 for the invalid period.

First Embodiment: Procedure for Operations in the System

Figure 9:
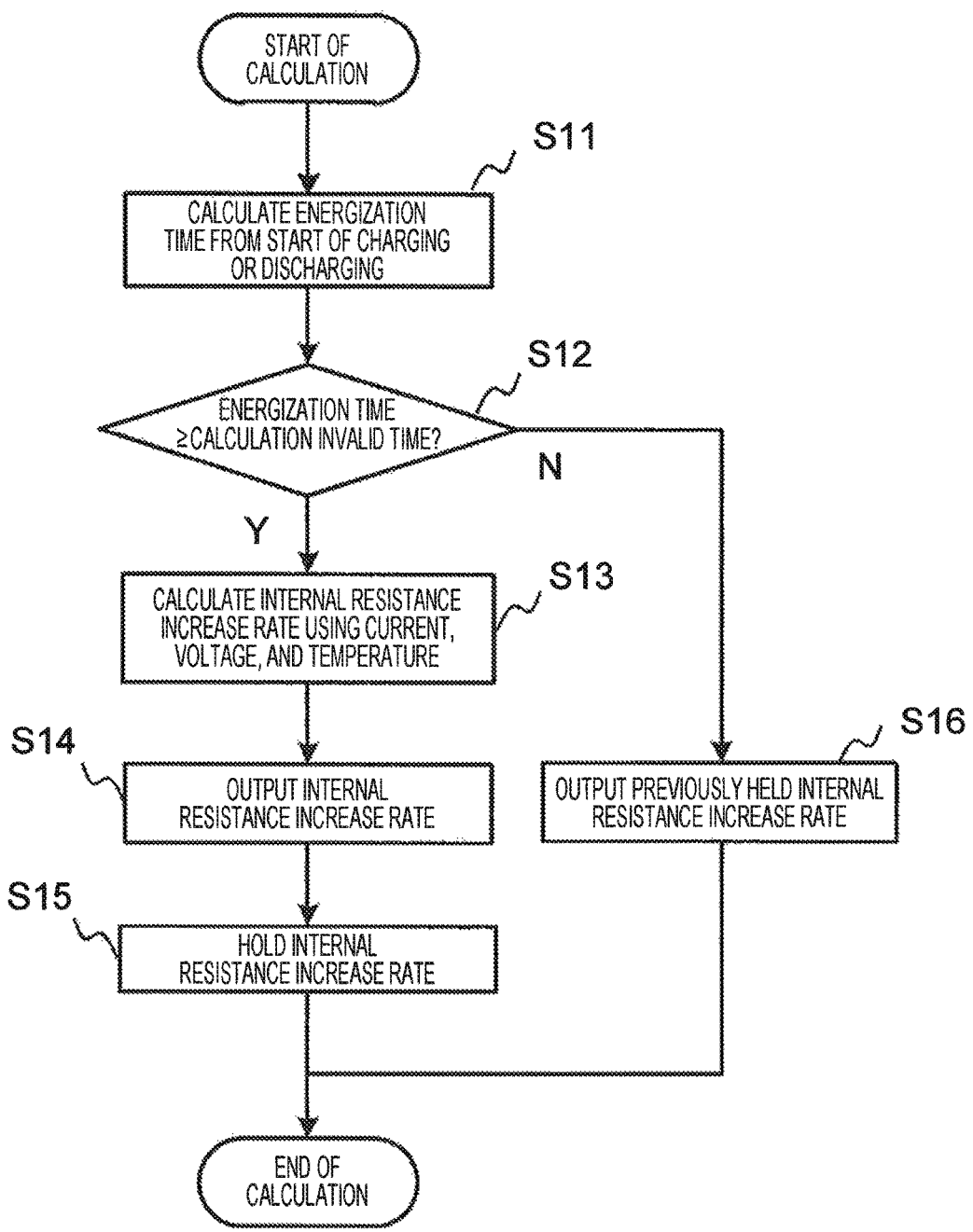
FIG. 9 is a flowchart of a procedure for operations by the assembled battery control unit 150 in the first embodiment.

The operational procedure for calculating the internal resistance increase rate of the assembled battery 110 by the assembled battery control unit 150 in the first embodiment will be described below with reference to FIG. 9. FIG. 9 is a flowchart of the procedure for operations by the assembled battery control unit 150 in the first embodiment.

(Step S11: Calculating the Energization Time)

At step S11, the internal resistance increase rate calculation unit 152 determines the polarity of the electric current flowing through the assembled battery 110 acquired by the current detection unit 130, and calculates the energization time from the start of charging or discharging. The energization time can be calculated by measuring time lapsed from the instant when charging or discharging is started from the state with no flow of electric current, or the instant when a switchover takes place from charging to discharging, or the instant when a switchover takes place from discharging to charging as zero time.

(Step S12: Determining the Invalid Period)

At step S12, the internal resistance increase rate calculation unit 152 compares the energization time determined at step S11 to the calculation invalid time set by the calculation invalid time setting unit 151. As a result, when the energization time is equal to or longer than the calculation invalid time, the internal resistance increase rate calculation unit 152 determines that the energization time falls within a valid period during which the calculation of the internal resistance increase rate is valid, and moves to step S13. In contrast, when the energization time is shorter than the calculation invalid time, the internal resistance increase rate calculation unit 152 determines that the energization time falls within an invalid period during which the calculation of the internal resistance increase rate is invalid, and moves to step S16.

(Step S13 (Determined as Valid): Calculating the Internal Resistance Increase Rate)

At step S13, the internal resistance increase rate calculation unit 152 calculates the internal resistance increase rate SOHR of the assembled battery 110 by the foregoing (equation 2) and (equation 3) based on the current flowing through the assembled battery 110 acquired by the current detection unit 130, the voltage acquired by the voltage detection unit 140, and the temperature detected by the temperature detection unit 125.

(Step S14 (Determined as Valid): Outputting the Internal Resistance Increase Rate)

At step S14, the internal resistance increase rate calculation unit 152 outputs the internal resistance increase rate SOHR calculated at step S13 to the deterioration state determination unit 153.

(Step S15 (Determined as Valid): Holding the Internal Resistance Increase Rate)

At step S15, the internal resistance increase rate calculation unit 152 holds therein the internal resistance increase rate SOHR calculated at step S13 and terminates the calculation.

(Step 16 (Determined as Invalid): Outputting the Previous Internal Resistance Increase Rate)

At step S16, the internal resistance increase rate calculation unit 152 outputs the internal resistance increase rate SOHR held therein at step S15 having been previously executed, and terminates the calculation. For the case that the internal resistance increase rate SOHR is not stored or held such as immediately after the activation of the assembled battery control unit 150, a predetermined initial value may be decided in advance and output this time. Alternatively, the internal resistance increase rate SOHR may be stored in a non-volatile memory such that the stored information is not lost even when the assembled battery control unit 150 is powered off, and may be read and output this time.

First Embodiment: Conclusion

According to the battery control device 120 in the first embodiment, the following advantages can be provided:

(1) The battery control device 120 includes the current detection unit 130 that detects an electric current flowing through the assembled battery 110, the voltage detection unit 140 that detects the voltage between the both ends of the assembled battery 110, the temperature detection unit 125 that detects the temperature of the assembled battery 110, and the internal resistance increase rate calculation unit 152, and the calculation invalid time setting unit 151 that sets a predetermined calculation invalid time according to the characteristics of the internal resistance increase rate SOHR of the assembled battery 110. The internal resistance increase rate calculation unit 152 calculates the internal resistance increase rate SOHR of the assembled battery 110 by the foregoing (equation 2) and (equation 3) based on the current detected by the current detection unit 130, the voltage between the both ends detected by the voltage detection unit 140, and the temperature detected by the temperature detection unit 125. At that time, the internal resistance increase rate calculation unit 152 invalidates the calculation results of the internal resistance increase rate SOHR for the invalid period from the start of charging or discharging of the assembled battery 110 to the lapse of the calculation invalid time set by the calculation invalid time setting unit 151. Accordingly, it is possible to obtain the stable rate of increase in internal resistance value regardless of the energization time taking into account the characteristics of the rate of increase in internal resistance value of the assembled battery 110 in use. As a result, it is possible to avoid erroneous determination on the life of the assembled battery 110 and calculate more correct allowable power, which allows the assembled battery 110 to exert fully its performance.

(2) The internal resistance increase rate calculation unit 152 stops the calculation of the internal resistance increase rate SOHR for the invalid period to invalidate the calculation results of the internal resistance increase rate SOHR for the invalid period. Accordingly, it is possible to invalidate the calculation result of the internal resistance increase rate SOR for the invalid period in an easy and reliable manner.

(3) The battery control device 120 includes the deterioration state determination unit 153 that determines the health state of the assembled battery 110 based on the internal resistance increase rate calculated by the internal resistance increase rate calculation unit 152. The deterioration state determination unit 153 outputs a certain SOH as the health state of the assembled battery 110 for the invalid period based on the internal resistance increase rate held when the internal resistance increase rate calculation unit 152 has previously determined the calculation of the internal resistance increase rate SOR as valid. Accordingly, it is possible to output the correct health state of the assembled battery 110 even for the invalid period.

Second Embodiment

In the first embodiment, the internal resistance increase rate calculation unit 152 stops and invalidates the calculation of the internal resistance increase rate for the invalid period. In contrast, in a second embodiment, the deterioration state determination unit 153 excludes and invalidates the calculation results of the internal resistance increase rate by the internal resistance increase rate calculation unit 252 for the invalid period. The control blocks of the assembled battery control unit 150 in the second embodiment are identical to the control blocks in the first embodiment illustrated in FIG. 3.

In the second embodiment, the internal resistance increase rate calculation unit 152 calculates the internal resistance increase rate of the assembled battery 110 and outputs the calculation results to the deterioration state determination unit 153. At the same time, the internal resistance increase rate calculation unit 152 also outputs the information on the results of comparison between the energization time and the calculation invalid time to the deterioration state determination unit 153.

When the information output from the internal resistance increase rate calculation unit 152 indicates that the energization time is equal to or longer than the calculation invalid time, the deterioration state determination unit 153 determines that the energization time falls within the valid period, and determines the calculation results of the internal resistance increase rate as valid. In this case, the deterioration state determination unit 153 determines the degree of deterioration of the assembled battery 110 based on the calculation results of the internal resistance increase rate output from the internal resistance increase rate calculation unit 152. Then, the deterioration state determination unit 153 outputs the SOH according to the determined degree of deterioration and the value of allowable power chargeable and dischargeable by the assembled battery 110 to the electric cell control units 121a, 121.b and the vehicle control unit 200, and holds the same therein at the same time. In contrast, when the energization time is shorter than the calculation invalid time, the deterioration state determination unit 153 determines that the energization time falls within the invalid period and invalidates the calculation results of the internal resistance increase rate. In this case, the deterioration state determination unit 153 stops the determination on the degree of deterioration of the assembled battery 110, and outputs the certain values of SOH and allowable power held therein when having previously determined the calculation results of the internal resistance increase rate as valid. Accordingly, the deterioration state determination unit 153 determines the degree of deterioration of the assembled battery 110 to the exclusion of the calculation results of the internal resistance increase rate for the invalid period.

Second Embodiment: Procedure for Operations in the System

Figure 10:
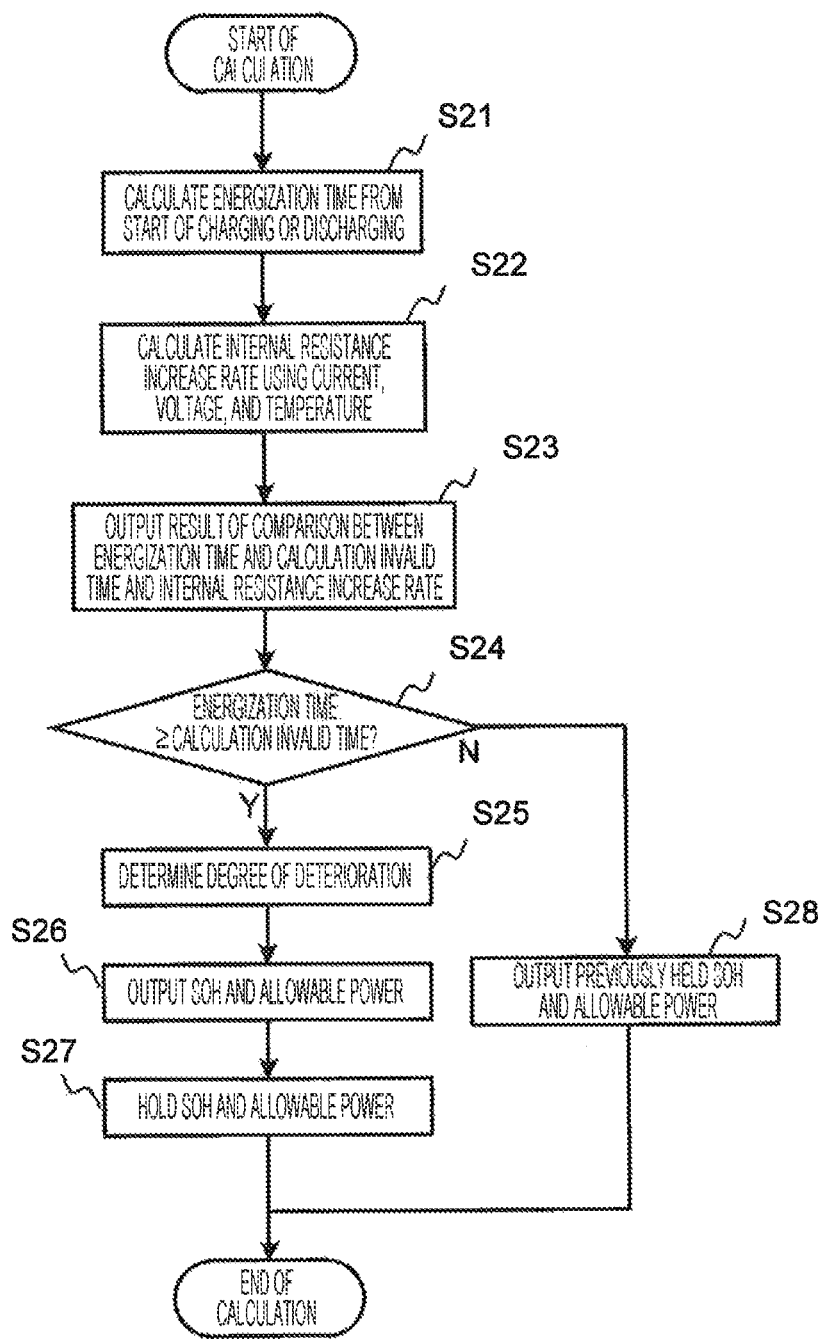
FIG. 10 is a flowchart of a procedure for operations by the assembled battery control unit 150 in a second embodiment.

The operational procedure for calculating the internal resistance increase rate of the assembled battery 110 by the assembled battery control unit 150 in the second embodiment will be described below with reference to FIG. 10. FIG. 10 is a flowchart of the procedure for operations by the assembled battery control unit 150 in the second embodiment.

(Step S21: Calculating the Energization Time)

At step S21, the internal resistance increase rate calculation unit 152 determines the polarity of an electric current flowing through the assembled battery 110 acquired by the current detection unit 130 and calculates the energization time from the start of charging or discharging as at step S11 described in FIG. 9.

(Step S22: Calculating the Internal Resistance Increase Rate)

At step S22, the internal resistance increase rate calculation unit 152 calculates the internal resistance increase rate SOHR of the assembled battery 110 as at step S13 described in FIG. 9.

(Step S23: Outputting the Results of Comparison Between the Energization Time and the Calculation Invalid Time and the Internal Resistance Increase Rate)

At step S23, the internal resistance increase rate calculation unit 152 compares the energization time determined at step S21 to the calculation invalid time set by the calculation invalid time setting unit 151. Then, the internal resistance increase rate calculation unit 152 outputs the information on the comparison result and the internal resistance increase rate SOHR calculated at step S22 to the deterioration state determination unit 153.

(Step S24: Determining the Invalid Period)

At step S24, the deterioration state determination unit 153 determines whether the energization time is equal to or longer than the calculation invalid time based on the information output from the internal resistance increase rate calculation unit 152 at step S23. As a result, when the energization time is equal to or longer than the calculation invalid time, the deterioration state determination unit 153 determines that the energization time falls within the valid period during which the calculation of the internal resistance increase rate is valid, and then moves to step S25. Meanwhile, when the energization time is shorter than the calculation invalid time, the deterioration state determination unit 153 determines that the energization time falls within the invalid period during which the calculation of the internal resistance increase rate is invalid, and moves to step S28.

(Step S25 (Determined as Valid): Determining the Degree of Deterioration)

At step S25, the deterioration state determination unit 153 determines the degree of deterioration of the assembled battery 110 based on the internal resistance increase rate SOHR output from the internal resistance increase rate calculation unit 152 at step S23.

(Step S26 (Determined as Valid): Outputting SOH and Allowable Power)

At step S26, the deterioration state determination unit 153 outputs the SOH according to the degree of deterioration determined at step S25 and the value of allowable power chargeable and dischargeable by the assembled battery 110 to the electric cell control units 121a, 121b and the vehicle control unit 200.

(Step S27 (Determined as Valid): Holding SOH and Allowable Power)

At step S27, the deterioration state determination unit 153 holds therein the SOH according to the degree of deterioration determined at step S25 and the value of allowable power chargeable and dischargeable by the assembled battery 11, and terminates the calculation.

(Step S28 (Determined as Invalid): Outputting Previous SOH and Allowable Power)

At step S28, the deterioration state determination unit 153 outputs the SOH and the value of allowable power held therein at step S27 having been previously executed, and terminates the calculation. For the case that no SOH or allowable power are stored or held such as immediately after the activation of the assembled battery control unit 150, predetermined SOH and allowable power may be decided in advance and output this time. Alternatively, the SOH and allocable power may be stored in a non-volatile memory such that the stored information is not lost even when the assembled battery control unit 150 is powered off, and may be read and output this time.

Second Embodiment: Conclusion

According to the battery control device 120 in the second embodiment, in addition to the advantage (1) described above in relation to the first embodiment, the following further advantages can be provided:

(4) The deterioration state determination unit 153 determines the degree of deterioration of the assembled battery 110 to the exclusion of the calculation results of the internal resistance increase rate SOR by the internal resistance increase rate calculation unit 152 for the invalid period to invalidate the calculation results of the internal resistance increase rate SOHR for the invalid period. Accordingly, it is possible to invalidate the calculation results of the internal resistance increase rate SOHR for the invalid period in an easy and reliable manner.

(5) The deterioration state determination unit 153 outputs a certain SOH previously held as the health state of the assembled battery 110 for the invalid period. Accordingly, it is possible to output the correct health state of the assembled battery 110 even for the invalid period.

Third Embodiment

In the first and second embodiments, the energization time from the start of charging or discharging is compared to the calculation invalid time to determine whether the calculation is valid or invalid, thereby to obtain the stable internal resistance increase rate of the battery even with the characteristics as illustrated in FIG. 8. In contrast, in a third embodiment, the calculation invalid time is set taking the magnitude of an, electric current into account to determine the internal resistance increase rate.

Figure 11:
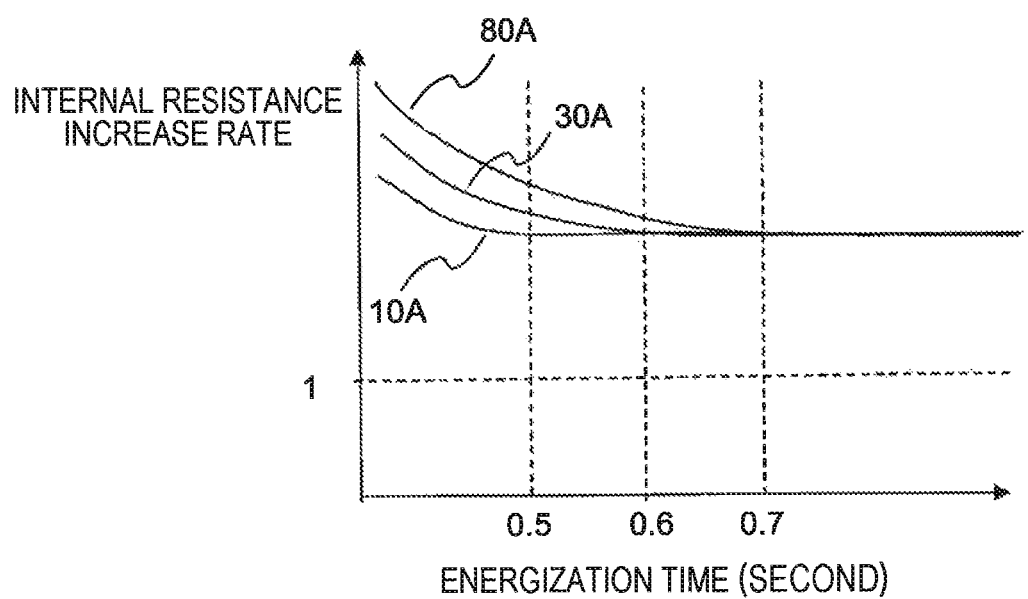
FIG. 11 is a graph indicating an example of the relationship between internal resistance increase rate and energization time in the event of deterioration of the battery.

FIG. 11 is a graph indicating an example of the relationship between internal resistance increase rate and energization time in the event of deterioration of the battery. The graph indicates the measurement results of the internal resistance increase rate with changes in the energization time in the cases where the absolute values of an electric current flowing through the battery are 10 A, 30 A, and 80 A.

Referring to FIG. 11, the internal resistance increase rate acquired at 30 A gradually decreases with the passage of the energization time in the range where the energization time is about 0.6 second or less, and becomes almost constant after lapse of more than, about 0.6 second. Meanwhile, the internal resistance increase rate acquired at 10 A becomes almost constant after the energization time has passed about 0.5 second. The internal resistance increase rate acquired at 80 A becomes almost constant after the energization time has passed about 0.7 second.

As described above, some kind of battery may exhibit a constant internal resistance increase rate for different energization times depending on the magnitude of an electric current flowing through the battery. For such a battery, when the calculation invalid time is set by a single constant as in, the first embodiment, the stable internal resistance increase rate SOHR may not be obtained depending on the magnitude of the current and the length of the energization time. Accordingly, the degree of deterioration of the battery may not be correctly determined.

To determine correctly the degree of deterioration of the battery even with the characteristics as described in FIG. 11, in the third embodiment, the calculation invalid time setting unit 151 sets the calculation invalid time according to the magnitude of electric current. The internal resistance increase rate calculation unit 152 uses the calculation invalid time to determine whether the calculation is valid or invalid with the energization time as a parameter as described above in relation to the first embodiment.

Figure 12:
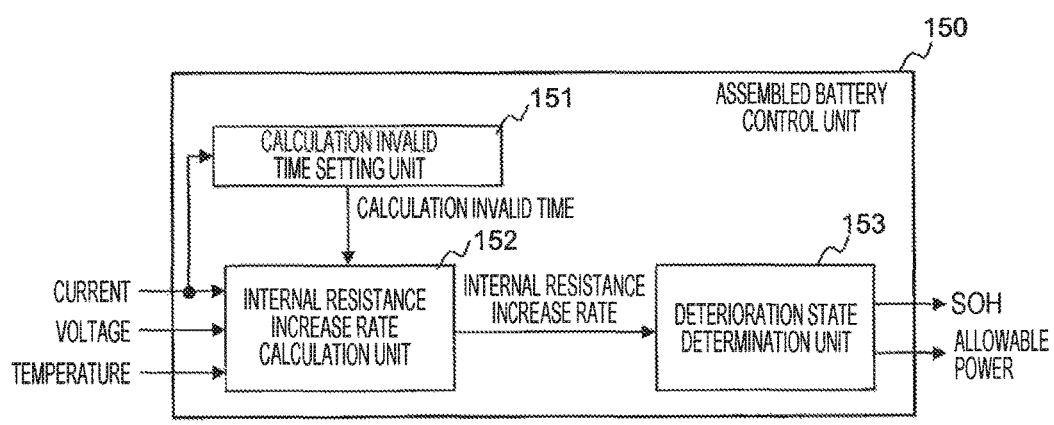
FIG. 12 is a diagram illustrating control blocks of the assembled battery control unit 150 according to a third embodiment.

FIG. 12 is a diagram illustrating control blocks of the assembled battery control unit 150 according to the third embodiment. Referring to FIG. 12, the difference from the control blocks in the first embodiment illustrated in FIG. 3 is in that the information on the current detected by the current detection unit 130 is also input into the calculation invalid time setting unit 151.

In the third embodiment, the calculation invalid time setting unit 151 sets the calculation invalid time according to the magnitude of the current detected by the current detection unit 130, and outputs the calculation invalid time to the internal resistance increase rate calculation unit 152.

FIG. 13 is a diagram illustrating an example of a calculation invalid time map for use in setting the calculation invalid time by the calculation invalid time setting unit 151. In the calculation invalid time map, calculation invalid times are determined on the axis of absolute values of current. From the calculation invalid time map of FIG. 13, a calculation invalid time of 0.5 second is obtained with a current of 10 A, for example. Similarly, calculation invalid times of 0.6 second and 0.7 second are obtained with currents of 30 A and 80 A, respectively. In this example, the values of currents detected by the current detection unit 130 are converted into absolute values. However, the currents may not be expressed by absolute values in the case where the characteristics differ between charging and discharging. In addition, the magnitudes of current for setting the calculation invalid time may be obtained as necessary by performing an averaging process or an offset error correcting process.

In the foregoing example, the calculation invalid time map is used to set the calculation invalid time according to the magnitude of current. However, the calculation invalid time may be set by an alternative method. For example, correction factors pre-decided according to the magnitudes of current may be stored in a correction factor map so that the calculation invalid time can be determined by multiplying a predetermined single constant by the correction factor selected from the correction coefficient map. In this case, the correction factor map has the correction factors by which calculation invalid times can be obtained according to the magnitudes of current on the axis of absolute values of current.

Third Embodiment: Conclusion

According to the battery control device 120 in the third embodiment, the calculation invalid time setting unit 151 sets the calculation invalid time according to the magnitude of current flowing through the assembled battery 110. Accordingly, it is possible to obtain the stable internal resistance increase rate of the assembled battery 110 even with characteristics in which the resistance increase rate becomes constant for different energization times depending on the magnitude of current.

Fourth Embodiment in a fourth embodiment, the calculation invalid time is set taking the energization time into account to determine the internal resistance increase rate.

Figure 14:
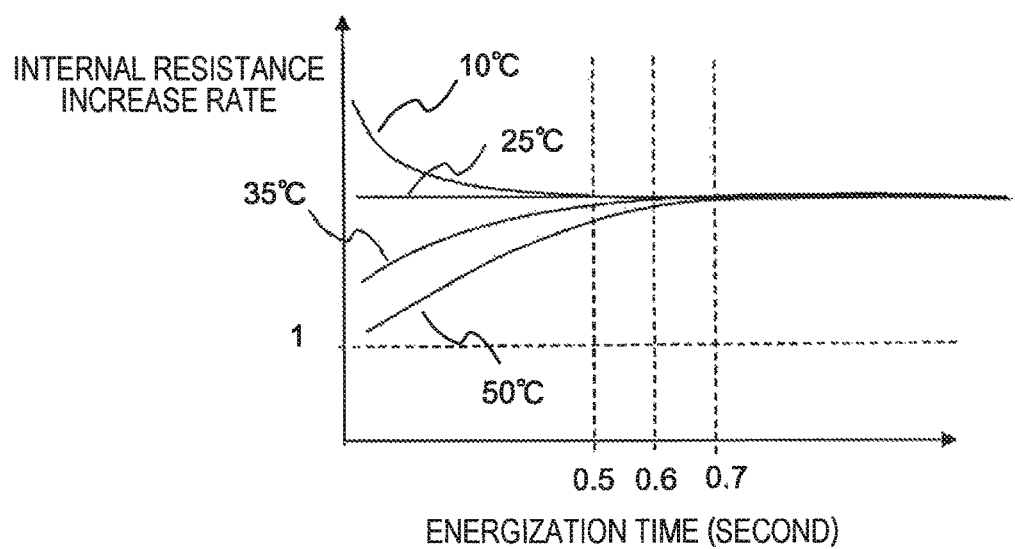
FIG. 14 is a graph indicating an example of the relationship between internal resistance increase rte and energization time in the event of deterioration of the battery.

FIG. 14 is a graph indicating an example of the relationship between internal resistance increase rate and energization time in the event of deterioration of the battery. The graph indicates the measurement results of the internal resistance increase rate with changes in the energization time in the cases where the temperatures of the battery are 10° C., 25° C., 35° C., and 50° C.

Referring to FIG. 14, the internal resistance increase rate acquired at 25° C. remains almost constant even with changes in the energization time, whereas the internal resistance increase rate acquired at 10° C. gradually decreases with the passage of the energization time in the range where the energization time is about 0.5 second or less, and becomes almost constant after the energization time has passed about 0.5 second. In contrast to this, the internal resistance increase rate acquired at 35° C. gradually increases with the passage of the energization time in the range where the energization time is about 0.6 second or less, and becomes almost constant after the energization time has passed about 0.6 second. The internal resistance increase rate acquired at 50° C. becomes almost constant after the energization time has passed about 0.7 second.

As described above, some kind of battery may exhibit a constant internal resistance increase rate for different energization times depending on the temperature. For such a battery, when the calculation invalid time is set by a single constant as in the first embodiment, the stable internal resistance increse rate SOHR may not be obtained depending on the temperature of the battery and the length of the energization time. Accordingly, the degree of deterioration of the battery may not be correctly determined.

To determine correctly the degree of deterioration of the battery even with the characteristics as described in FIG. 14, in the fourth embodiment, the calculation invalid time setting unit 151 sets the calculation invalid time according to the temperature. The internal resistance increase rate calculation unit 152 uses the calculation invalid time to determine whether the calculation is valid or invalid with the energization time as a parameter as described above in relation to the first embodiment.

Figure 15:
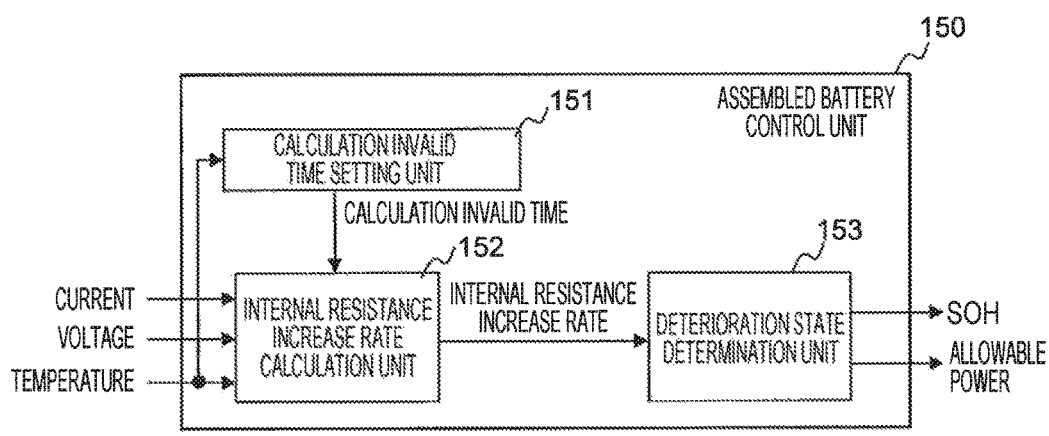
FIG. 15 is a diagram illustrating control blocks of the assembled battery control unit 150 according to a fourth embodiment.

FIG. 15 is a diagram illustrating control blocks of the assembled battery control unit 150 according to the fourth embodiment. Referring to FIG. 15, the difference from the control blocks in the first embodiment illustrated in FIG. 3 is in that information on the temperature detected by the temperature detection unit 125 is also input into the calculation invalid time setting unit 151.

In the fourth embodiment, the calculation invalid time setting unit 151 sets the calculation invalid time according to the temperature detected by the temperature detection unit 125, and outputs the calculation invalid time to the internal resistance increase rate calculation unit 152.

FIG. 16 is a diagram illustrating an example of a calculation invalid time map for use in setting the calculation invalid time by the calculation invalid time setting unit 11. In the calculation invalid time map, calculation invalid times are determined on the axis of temperatures. From the calculation invalid time map of FIG. 16, a calculation invalid time of 0.5 second is obtained with a temperature of 10° C., for example. Similarly, calculation invalid times of 0.6 second and 0.7 second are obtained with temperatures of 35° C. and 50° C., respectively. Although the temperature detected by the temperature detection unit 125 is used in this example, estimated temperatures obtained by performing an averaging process or a battery temperature model process may be used as necessary.

In the foregoing example, the calculation invalid time map is used to set the calculation invalid time according to the temperature. However, the calculation invalid time may be set by an alternative method. For example, correction factors re-decided according to temperatures may be stored in a correction factor map so that the calculation invalid time can be determined by multiplying a predetermined single constant by the correction factor selected from the correction coefficient map. In this case, the correction factor map has the correction factors by which calculation invalid times can be obtained according to temperatures on the axis of temperatures.

Fourth Embodiment: Conclusion

According to the battery control device 120 in the fourth embodiment, the calculation invalid time setting unit 151 sets the calculation invalid time according to the temperature of the assembled battery 110 detected by the temperature detection unit 125. Accordingly, it is possible to obtain the stable internal resistance increase rate even when the assembled battery 110 has the characteristics in which the internal resistance increase rate becomes constant for different energization times depending on the temperature.

Fifth Embodiment

In a fifth embodiment, the calculation invalid time is set taking the battery charging state into account to determine the internal resistance increase rate.

Figure 17:
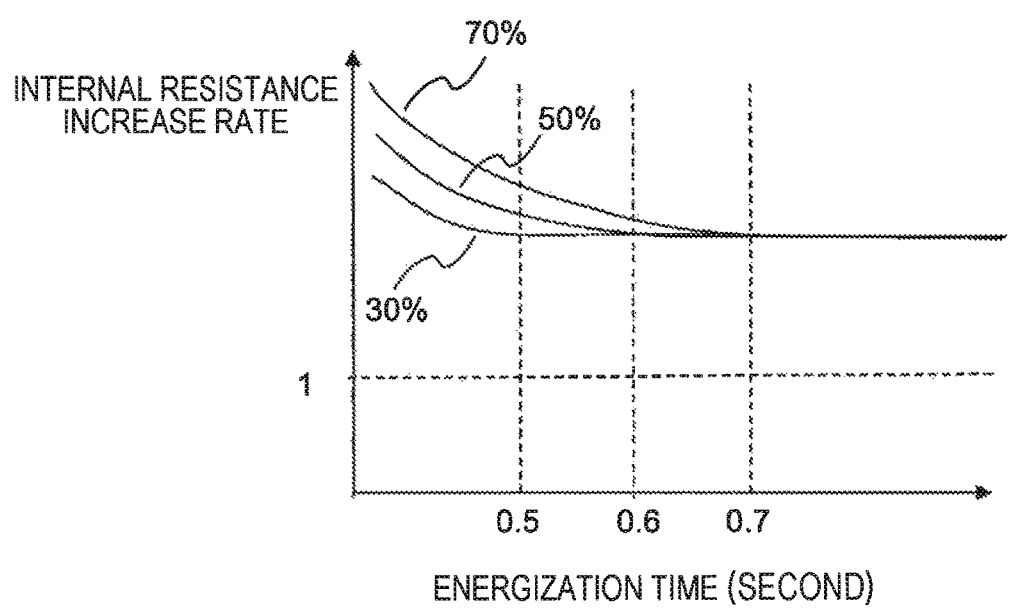
FIG. 17 is a graph indicating an example of the relationship between internal resistance increase rate and energization time in the event of deterioration of the battery.

FIG. 17 is a graph indicating an example of the relationship between internal resistance increase rate and energization time in the event of deterioration of the battery. The graph indicates the measurement results of the internal resistance increase rate with changes in the energization time in the cases where the SOC of the battery is 30%, 50%, and 70%.

Referring to FIG. 17, the internal resistance increase rate acquired at 30% gradually decreases with the passage of the energization time in the range where the energization time is about 0.5 second or less, and becomes almost constant after lapse of more than about 0.5 second. Meanwhile, the internal resistance increase rate acquired at 50% becomes almost constant after the energization time has passed about 0.6 second. The internal resistance increase rate acquired at 70% becomes almost constant after the energization time has passed about 0.7 second.

As described above, some kind of battery may exhibit a constant internal resistance increase rate for different energization times depending on the SOC of the battery. For such a battery, when the calculation invalid time is set by a single constant as in the first embodiment, the stable internal resistance increase rate SOHR may not be obtained depending on the charging state of the battery and the length of the energization time. Accordingly, the degree of deterioration of the battery may not be correctly determined.

To determine correctly the degree of deterioration of the battery even with the characteristics as described in FIG. 17, in the fifth embodiment, the calculation invalid time setting unit 151 sets the calculation invalid time according to the SOC of the battery. The internal resistance increase rate calculation unit 152 uses the calculation invalid time to determine whether the calculation is valid or invalid with the energization time as a parameter as described above in relation to the first embodiment.

Figure 18:
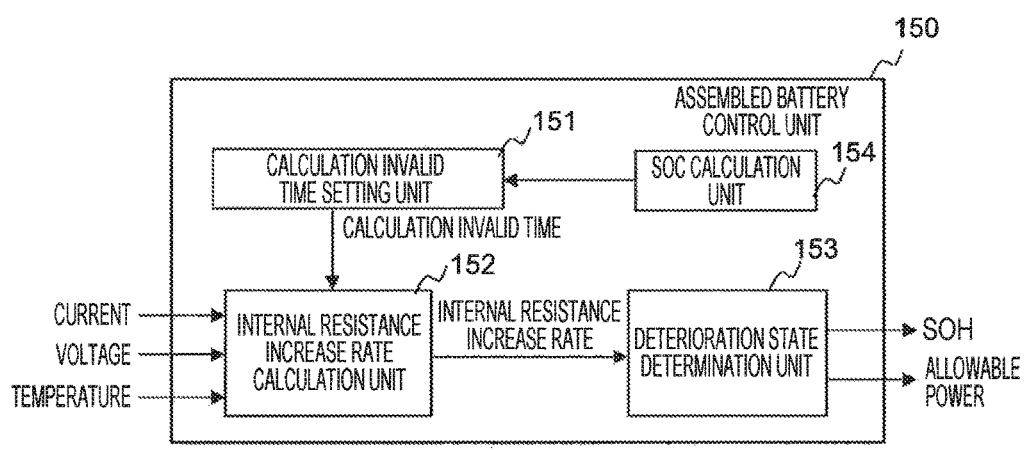
FIG. 18 is a diagram illustrating control blocks of the assembled battery control unit 150 according to a fifth embodiment.

FIG. 18 is a diagram illustrating control blocks of the assembled battery control unit 150 according to the fifth embodiment. Referring to FIG. 1, the difference from the control blocks in the first embodiment illustrated in FIG. 3 is in further including an SOC calculation unit 154.

In the fifth embodiment, the SOC calculation unit 154 calculates the SOC of the assembled battery 110, and outputs the calculation result to the calculation invalid time setting unit 151. In this example, the SOC may be calculated by any of known methods such as the SOC is determined from a plurality of combinations of current values and voltage values or is determined by integration of current values, for example. The calculation invalid time setting unit 151 sets the calculation invalid time according to the calculation result of the SOC by the SOC calculation unit 154, and outputs the calculation invalid time to the internal resistance increase rate calculation unit 152.

FIG. 19 is a diagram illustrating an example of a calculation invalid time map for use in setting the calculation invalid time by the calculation invalid time setting unit 151. In the calculation invalid time map, calculation invalid times are determined on the axis of SOC. From the calculation invalid time map of FIG. 19, a calculation invalid time of 0.5 second is obtained with a SOC of 30%, for example. Similarly, calculation invalid times of 0.6 second and 0.7 second are obtained with SOCs of 50% and 70%, respectively.

In the foregoing example, the calculation invalid time map is used to set the calculation invalid time according to SOC. However, the calculation invalid time may be set by an alternative method. For example, correction factors pre-decided according to SOC may be stored in a correction factor map so that the calculation invalid time can be determined by multiplying a predetermined single constant by the correction factor selected from the correction coefficient map. In this case, the correction factor map has the correction factors by which calculation invalid times can be obtained according to the SOC on the axis of SOC.

Fifth Embodiment: Conclusion

According to the battery control device 120 in the fifth embodiment, the calculation invalid time setting unit 151 sets the calculation invalid time according to the SOC of the assembled battery 110 calculated by the SOC calculation unit 154. Accordingly, it is possible to obtain the stable internal resistance increase rate of the assembled battery 110 even with characteristics in which the resistance increase rate becomes constant for different energization times depending on SOC.

Sixth Embodiment

In the first to fifth embodiments, the calculation invalid time is set and the energization time from the start of charging or discharging is compared to the calculation invalid time to determine whether the calculation is valid or invalid, thereby to obtain the stable internal resistance increase rate of the battery even with the characteristics as described in FIGS. 8, 11, 14, and 17. In contrast to this, in the sixth embodiment, the calculation invalid time is set taking into account the frequency at which the calculation is determined as valid and the internal resistance increase rate is updated to determine the internal resistance increase rate.

In the first to fifth embodiments, when the charging and discharging states of the assembled battery 110 frequently change and the energization times at the individual charging and discharging operations are relatively short, the calculation is more frequently determined as invalid to decrease the occasions for updating the calculation result of the internal resistance increase rate. Accordingly, even when the internal resistance increase rate of the assembled battery 110 changes, it is difficult to detect the actual change. Accordingly, the degree of deterioration of the assembled battery 110 may not be correctly determined.

To determine correctly the degree of deterioration of the assembled battery 110 in such a situation, in the sixth embodiment, the calculation invalid time setting unit 151 sets the calculation invalid time according to the frequency of updating the calculation result of the internal resistance increase rate. The internal resistance increase rate calculation unit 152 uses the calculation invalid time to determine whether the calculation is valid or invalid with the energization time as a parameter as described above in relation to the first embodiment.

Figure 20:
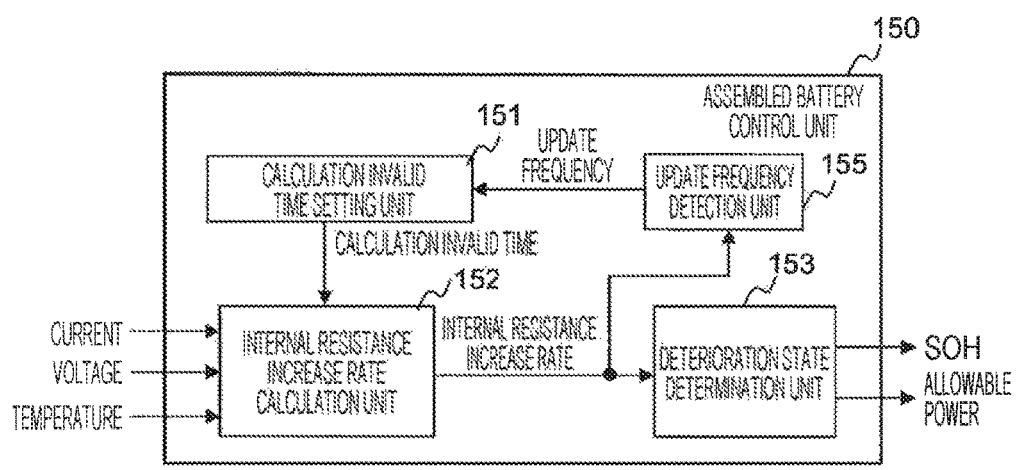
FIG. 20 is a diagram illustrating control blocks of the assembled battery control unit 150 according to a sixth embodiment.

FIG. 20 is a diagram illustrating control blocks of the assembled battery control unit 150 according to the sixth embodiment. Referring to FIG. 20, the difference from the control blocks in the first embodiment illustrated in FIG. 3 is in further including an update frequency detection unit 155.

In the sixth embodiment, the internal resistance increase rate from the internal resistance increase rate calculation unit 152 is input into the update frequency detection unit 155. The update frequency detection unit 155 detects the frequency of updating the internal resistance increase rate from the internal resistance increase rate calculation unit 152, and outputs the detection results to the calculation invalid time setting unit 151. The calculation invalid time setting unit 151 sets the calculation invalid time according to the updating frequency from the update frequency detection unit 155, and outputs the calculation invalid time to the internal resistance increase rate calculation unit 152. For example, in the case where the updating frequency is equal to or lower than a predetermined vale, the calculation invalid time setting unit 151 sets the calculation invalid time to be shorter than usual.

This allows the calculation invalid time setting unit 151 to set the calculation invalid time according to the frequency of calculating the internal resistance increase rate when the internal resistance increase rate calculation unit 152 has determined the calculation as valid. Accordingly, even if the energization time is short, the calculation becomes more prone to be determined as valid by the internal resistance increase rate calculation unit 152, thereby increasing the occasions for updating the internal resistance increase rate.

Sixth Embodiment: Procedure for Operations in the System

Figure 21:
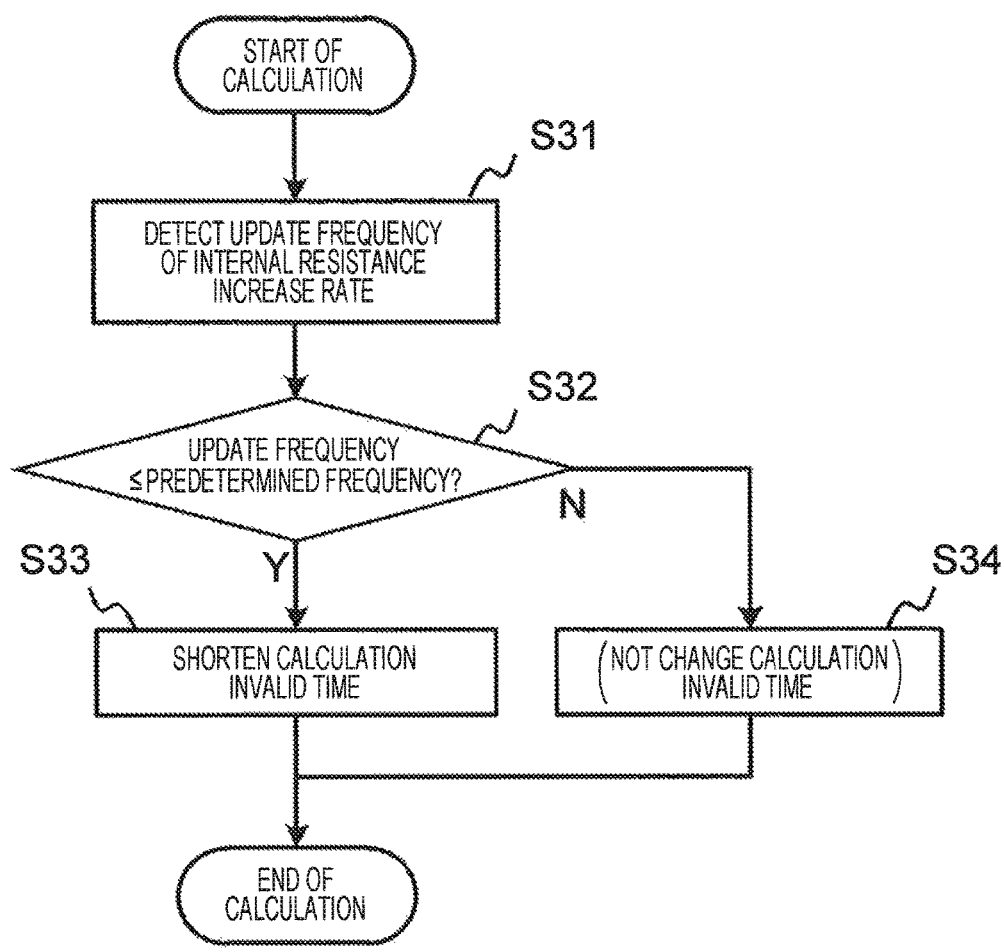
FIG. 21 is a flowchart of a procedure for operations by the assembled battery control unit 150 in the sixth embodiment.

The operational procedure for changing the calculation invalid time by the assembled battery control unit 150 in the sixth embodiment will be described below with reference to FIG. 21. FIG. 21 is a flowchart of the procedure for operations by the assembled battery control unit 150 in the sixth embodiment.

(Step S31: Detecting the Updating Frequency)

At step S31, the update frequency detection unit 155 detects the frequency of updating the internal resistance increase rate acquired by the internal resistance increase rate calculation unit 152, and outputs the same to the calculation invalid time setting unit 151. The updating frequency can be expressed by an index such as the number of updates per unit time or the accumulated number of updates from a certain point in time as a starting point, for example. As descried above in relation to the first embodiment, when determining that the calculation results of the internal resistance increase rate as valid, the internal resistance increase rate calculation unit 152 calculates the internal resistance increase rate and updates the value held therein and outputs the current value at the same time. In contrast, when determining the calculation results of the internal resistance increase rate as invalid, the internal resistance increase rate calculation unit 152 stops the calculation of the internal resistance increase rate, and outputs the previously held value. Accordingly, the update frequency detection unit 155 can detect the updating frequency by the use of changes in the value of the internal resistance increase rate output from the internal resistance increase rate calculation unit 152. In addition, when the internal resistance increase rate calculation unit 152 outputs the information indicating whether the calculation results are valid or invalid as described above, the update frequency detection unit 155 may use the information.

(Step S32: Determining the Updating Frequency)

At step S32, the calculation invalid time setting unit 151 compares the updating frequency output from the update frequency detection unit 155 at step S31 to a predetermined frequency. In this example, the predetermined frequency may be a previously stored preset value or a value calculated according to conditions. For example, the predetermined frequency may be decreased when the vehicle is in operating state in which the internal resistance increase rate is determined as more variable, whereas the predetermined frequency may be increased when the vehicle is in operating state in which the internal resistance increase rate is determined as less variable. Alternatively, the predetermined frequency may be decreased immediately after the replacement of the battery and then may be gradually increased.

When the updating frequency is found to be equal to or lower than the predetermined frequency through the comparison between the updating frequency and the predetermined frequency at step S32, the process moves to step S33. In the other case, the process moves to step S34.

(Step S33: Shortening the Calculation Invalid Time)

At step S33, the calculation invalid time setting unit 151 corrects or changes the calculation invalid time to be shorter. For example, to shorten the calculation invalid time, a predetermined value may be subtracted from the preset calculation invalid time, or the preset calculation invalid time may be multiplied by a predetermined correction factor. Alternatively, the calculation invalid time may be changed according to the difference between the updating frequency and the predetermined freuency compared at step S32.

(Step S34: Not Changing the Calculation Invalid Time)

At step S34, the calculation invalid time setting unit 151 does not change the calculation invalid time but keeps the previous value. At that time, when the calculation invalid time has been changed to be shorter at step S33 in the previous calculation cycle, the calculation invalid time setting unit 151 returns the calculation invalid time to the original value.

Sixth Embodiment: Conclusion

According to the battery control device 120 in the sixth embodiment, the calculation invalid time setting unit 151 sets the calculation invalid time according to the frequency of calculating the internal resistance increase rate by the internal resistance increase rate calculation unit 152 based on the updating frequency detected by the update frequency detection unit 155. Accordingly, when the occasions for updating the calculation result of the internal resistance increase rate are few, it is possible to determine correctly the degree of deterioration of the assembled battery 110 while securing the occasions for updating.

In the sixth embodiment described above, the internal resistance increase rate calculation unit 152 may set the degree of reliability of the calculation results of the internal resistance increase rata based on the length of the calculation invalid time set by the calculation invalid time setting unit 151. For example, when the calculation invalid time is set to be short, the degree of reliability is set to be lower than that in the other case. The internal resistance increase rate calculation unit 152 outputs the thus set degree of reliability to the deterioration state determination unit 153, and the deterioration state determination unit 153 can determine the degree of deterioration of the assembled battery 110 in a more correct manner.

The foregoing embodiments may be used in any combination.

In the foregoing embodiments, the assembled battery control unit 150 calculates the internal resistance increase rate of the assembled battery 110, and calculates the SOH and allowable power of the assembled battery 110 according to the calculation result. Alternatively, instead of the assembled battery 110, the internal resistance increase rates of the electric cell groups 112a and 112b may be calculated so that the SOHs and allowable powers of these groups are calculated according to the calculation results. Otherwise, the same calculations may be performed on the individual electric cells 111.

The present invention is not limited to the foregoing embodiments but can be modified in various manners without deviating from its gist.

Some or all of the components and functions described above may be implemented as hardware using an integrated circuit or the like, or may be implemented as programs or software applications to be executed by a processor, for example. The information on the programs and tables for implementation of the functions may be stored in storage devices such as memories and hard discs, or storage media such as IC cards and DVDs.

REFERENCE SIGNS LIST

100 Battery system
110 Assembled battery
111 Electric cell
112a and 112b Electric cell group
120 Battery control device
121a and 121b Electric cell control unit
122 Voltage detection unit
123 Control circuit
124 Signal input/output circuit
125 Temperature detection unit
130 Current detection unit
140 Voltage detection unit
150 Assembled battery control unit
151 Calculation invalid time setting unit
152 Internal resistance increase rate calculation unit
152 SOC calculation unit
153 Deterioration state determination unit
154 SOC calculation unit
155 Update frequency detection unit
160 Signal communication path
170 Insulation
180 Storage unit
200 Vehicle control unit
300, 310, 320, and 330: Relay
400 Invertor 410 Motor generator
420 Battery charger

The invention claimed is:

1. A battery control device, comprising:
a current detector that detects an electric current flowing through a battery;
a voltage detector that detects a voltage between both ends of the battery;
a temperature sensor that detects a temperature of the battery; and
a controller programmed to
calculate an internal resistance increase rate of the battery based on the electric current detected by the current detector, the voltage between the both ends detected by the voltage detector, and the temperature detected by the temperature sensor;
obtain calculation results of the internal resistance increase rate which correspond to a degree of deterioration of the battery, by setting a predetermined calculation invalid time based on the internal resistance increase rate,
wherein the calculation results of the internal resistance increase rate are invalidated for an invalid period from a start of charging or discharging of the battery to a lapse of the calculation invalid time by stopping calculation of the internal resistance increase rate for the invalid period to obtain a stable rate of increase in an internal resistance value of the battery, and
wherein the calculation invalid time is increased when the electric current is increased; and
control the charging and the discharging of the battery based on the calculation results of the internal resistance increase rate.

2. The battery control device according to claim 1, wherein the controller stops the calculation of the internal resistance increase rate for the invalid period to invalidate the calculation results of the internal resistance increase rate for the invalid period.

3. The battery control device according to claim 2, wherein the controller is further programmed to determine the health state of the battery based on the internal resistance increase rate, wherein the deterioration state determination unit outputs a certain SOH as the health state of the assembled battery for the invalid period.

4. The battery control device according to claim 1, wherein the controller is further programmed to determine the health state of the assembled battery based on the internal resistance increase rate, wherein
the controller determines the degree of deterioration of the assembled battery to the exclusion of the calculation results of the internal resistance increase rate for the invalid period to invalidate the calculation results of the internal resistance increase rate for the invalid period.

5. The battery control device according to claim 4, wherein the controller outputs a certain health state as the health state of the battery for the invalid period.

6. The battery control device according to claim 1, wherein the controller sets the calculation invalid time according to the magnitude of the electric current detected by the current detector.

7. The battery control device according to claim 1, wherein the controller sets the calculation invalid time according to the temperature.

8. The battery control device according to claim 1, wherein the controller is further programmed to calculate the charging state of the battery, wherein
the controller sets the calculation invalid time according to the charging state.

9. The battery control device according to claim 1, wherein the controller sets the calculation invalid time according to the frequency of calculating the internal resistance increase rate.

10. The battery control device according to claim 9, wherein the controller sets the degree of reliability of the calculation results of the internal resistance increase rate based on the length of the calculation invalid time.

11. The battery control device according to claim 1, wherein the calculation invalid time is increased when the temperature is higher or lower than a predetermined temperature.

12. The battery control device according to claim 1, wherein the calculation invalid time is increased when a state of charge (SOC) of the battery is increased.

* * * * *